United States Patent
Tang

(10) Patent No.: US 9,933,756 B2
(45) Date of Patent: Apr. 3, 2018

(54) SMART WATCH

(71) Applicant: Wuhan China Star Optoelectronics Technology Co., Ltd., Wuhan (CN)

(72) Inventor: Yuejun Tang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 80 days.

(21) Appl. No.: 15/245,188

(22) Filed: Aug. 24, 2016

(65) Prior Publication Data

US 2017/0364036 A1    Dec. 21, 2017

(30) Foreign Application Priority Data

Jun. 20, 2016   (CN) .......................... 2016 1 0450357

(51) Int. Cl.
*G04G 9/00* (2006.01)
*H01L 51/00* (2006.01)
*H01L 51/52* (2006.01)
*A44C 5/14* (2006.01)

(52) U.S. Cl.
CPC ............. *G04G 9/0088* (2013.01); *A44C 5/14* (2013.01); *H01L 51/0097* (2013.01); *H01L 51/5237* (2013.01)

(58) Field of Classification Search
CPC .................................................. G04G 9/0088
See application file for complete search history.

(56) References Cited

U.S. PATENT DOCUMENTS 5,212,966 A * 5/1993 Minami ............... A44C 5/0053
2/338
8,014,635 B2 * 9/2011 Kondo ................. G06F 1/1616
382/312

FOREIGN PATENT DOCUMENTS

CN       204241854 U    4/2015
CN       204631448 U    9/2015

* cited by examiner

*Primary Examiner* — Edwin A. Leon
*Assistant Examiner* — Jason Collins
(74) *Attorney, Agent, or Firm* — Leong C. Lei

(57) ABSTRACT

The invention discloses a smart watch, which comprises: a dial (10), a first and a second straps (20,24), connected respectively to both sides of the dial (10); wherein a first and a second displays (12,13) are disposed respectively on a front and a back of the shell body (11) of the dial (10), the first and second straps (20,24) are disposed with a plurality of clasps (21) and clasp holes (22) correspondingly, and the first and second displays (12,13) can have the same or different shapes and sizes, depending on whether the watch is worn on front or back, so that when worn on different side, different display is viewed to achieve complex application. Designing different appearances for the front and back of smart watch satisfies various esthetics, and manufacturing the first and second displays (12,13) monolithically simplifies the control circuit to improve smart watch quality.

9 Claims, 4 Drawing Sheets

SMART WATCH

BACKGROUND OF THE INVENTION

1. Field of the Invention

The present invention relates to the field of display technique, and in particular to a smart watch.

2. The Related Arts

In recent years, the liquid crystal display (LCD) and organic light-emitting diode (OLED) display have replaced the cathode ray tube (CRT) and become the mainstream display technology; wherein the LCD is the most widely used and has the largest market share. On the other hand, the OLED display has the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

As the formats of the electronic products become versatile for various demands, the wearable smart devices become the newest trend after the smart phone. The wearable smart devices are getting popular due to convenience. The most common wearable devices are eyeglasses, hat, and watches, wherein the most common wearable smart device is the smart watch, which provides users with more revolutionary experience. Most known smart watch can be connected to mobile phones, to provide users with news and e-mail reminders, and can achieve a certain degree of Internet access. In addition, as smart watch is worn on the user's wrist, the smart watch can easily measure the wearer's blood pressure, heart rate, body temperature and other data, to achieve health and fitness monitoring and greatly improve the life quality.

The known smart watches are generally equipped with a separate display screen. With the increasing complexity of smart watch functions, a larger display screen is desirable to achieve effective human machine interaction, which the known smart watch with single screen cannot satisfy. Also, as the esthetics advances, the appearance of smart watch gains increasing attention. The known smart watch only comes in a type of appearance, which is no longer satisfactory to various esthetics.

SUMMARY OF THE INVENTION

The object of the present invention is to provide a smart watch, able to be worn on both sides and used in complex functions to satisfy versatile demands on esthetics, simplify the control circuit, and improve product quality.

To achieve the above object, the present invention provides a smart watch, which comprises: a dial, a first strap and a second strap, connected respectively to both sides of the dial; the dial comprising a shell body, a first display disposed on a front of the shell body, a second display disposed on a back of the shell body, and a control circuit disposed inside the shell body to electrically connect the first display and the second display.

According to a preferred embodiment of the present invention, the first strap is disposed with a plurality of clasps; the second strap is disposed with a plurality of clasp holes corresponding to the plurality of clasps, and a retainer movable along the second strap; the clasps are dual-sided clasps.

According to a preferred embodiment of the present invention, the first display and the second display are of the same or difference sizes and shapes.

According to a preferred embodiment of the present invention, the fronts of the shell body, the first strap, the second strap have different appearances from the backs of the shell body, the first strap, the second strap.

According to a preferred embodiment of the present invention, the first display and the second display are made monolithically from a display motherboard and are controlled by the same control circuit.

According to a preferred embodiment of the present invention, the display motherboard is a flexible OLED display motherboard; the display motherboard comprises: a substrate, a light-emitting layer disposed on the substrate, an encapsulation layer disposed on the substrate surrounding the light-emitting layer, and a control circuit connection area disposed on the substrate outside of the layer encapsulation layer; the substrate being a flexible substrate, comprising a first light-emitting area, a first bending area, a connection area, a second bending area, and a second light-emitting area disposed consecutively; the light-emitting layer covering the first light-emitting area and the second light-emitting area, and being disposed with a trench corresponding to the locations of the first bending area, the connection area, and the second bending area; the first light-emitting area and the second light-emitting area covered by the light-emitting layer being electrically connected through metal wires penetrating the trench; the display motherboard having a bend at the first bending area and a second bending area respectively so that the first light-emitting area and the second light-emitting area located respectively on the front and the back of the shell body, and being connected to a control circuit through the control circuit connection area to form the first display and the second display.

According to a preferred embodiment of the present invention, the dial further comprises a third display disposed on the side of the shell body.

According to a preferred embodiment of the present invention, the first display, the second display and the third display are made monolithically from a display motherboard, and are controlled by the same control circuit.

According to a preferred embodiment of the present invention, the display motherboard is a flexible OLED display motherboard; the display motherboard comprises: a substrate, a light-emitting layer disposed on the substrate, an encapsulation layer disposed on the substrate surrounding the light-emitting layer, and a control circuit connection area disposed on the substrate outside of the layer encapsulation layer; the substrate being a flexible substrate, comprising a first light-emitting area, a first bending area, a connection area, a second bending area, and a second light-emitting area disposed consecutively; the light-emitting layer covering the first light-emitting area, the connection area and the second light-emitting area, and being disposed with a trench corresponding to the locations of the first bending area, and the second bending area; the first light-emitting area, the connection area and the second light-emitting area covered by the light-emitting layer being electrically connected through metal wires penetrating the trench; the display motherboard having a bend at the first bending area and a second bending area respectively so that the first light-emitting area, the connection area and the second light-emitting area located respectively on the front, the side and the back of the shell body, and being connected to a control circuit through the control circuit connection area to form the first display, the third display and the second display.

According to a preferred embodiment of the present invention, the display motherboard is a flexible OLED display motherboard; the display motherboard comprises: a substrate, a light-emitting layer disposed on the substrate, an encapsulation layer disposed on the substrate surrounding the light-emitting layer, and a control circuit connection area disposed on the substrate outside of the layer encapsulation layer; the substrate being a flexible substrate, comprising a first light-emitting area, a first bending area, a connection area, a second bending area, and a second light-emitting area disposed consecutively; the light-emitting layer covering the first light-emitting area, the first bending area, the connection area, the second bending area, and the second light-emitting area; the display motherboard having a bend at the first bending area and a second bending area respectively so that the first light-emitting area, the connection area and the second light-emitting area located respectively on the front, the side and the back of the shell body, and being connected to a control circuit through the control circuit connection area to form the first display, the third display and the second display.

The present invention provides the following advantages: the present invention provides a smart watch, which comprises: a dial, a first strap and a second strap, connected respectively to both sides of the dial; wherein a first display and a second display are disposed respectively on a front and a back of the shell body of the dial, the first and the second straps are disposed with a plurality of clasps and clasp holes correspondingly, and the first and the second displays can have the same or different shapes and sizes, depending on the design for the watch to be worn on both front and back, so that when worn on different side, different display can be viewed to realize more complex application. Designing different appearances for the front and back of the smart watch satisfies various esthetics, and manufacturing the first and second displays monolithically simplifies the control circuit to improve quality of the smart watch.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
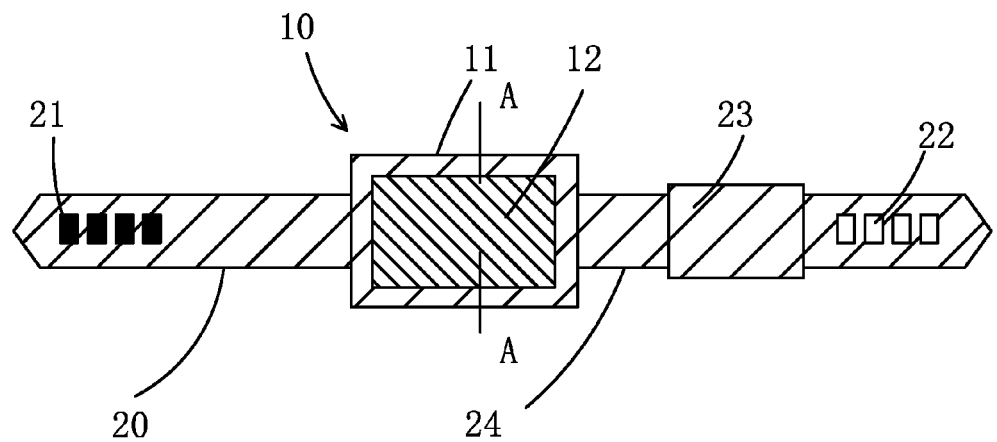
FIG. 1 is a schematic view showing the structure of the front of the smart watch provided by the first, second and third embodiments of the present invention.

To further explain the technical means and effect of the present invention, the following refers to embodiments and drawings for detailed description.

Refer to FIGS. 1-11. The present invention provides a smart watch, which comprises: a dial 10, a first strap 20 and a second strap 24, connected respectively to both sides of the dial 10.

The dial 10 comprises: a shell body 11, a first display 12 disposed on a front of the shell body 110, a second 13 disposed on a back of the shell body 11, and a control circuit disposed inside the shell body 11 to electrically connect the first display 12 and the second display 13.

Specifically, the smart watch is a smart device installed with a smart operating system, able to connect wirelessly to a mobile phone and to Internet to provide users with news and e-mail reminders, as well as to measure the wearer's blood pressure, heart rate, body temperature and other data, to achieve health and fitness monitoring.

Specifically, the first strap 20 and the second strap 24 are disposed to realize the smart watch to be worn on both front and back. Preferably, the first strap 20 is disposed with a plurality of clasps 21; and the second strap 24 is disposed with a plurality of clasp holes 22 corresponding to the plurality of clasps 21, and a retainer 23 movable along the second strap 24. The clasps 21 are dual-sided clasps. When a user wears the smart watch, the user can wear the smart watch with the front or the back facing upwards because the clasps 21 are dual-sided and able to fasten with corresponding clasp hole 22. The retainer 23 is then moved to the joint of the clasps 21 and clasp holes 22 to protect the clasps 21 and clasp holes 22. Hence, with the clasps 21 and clasp holes 22, the smart watch can be worn on both front and back sides.

Figure 2:
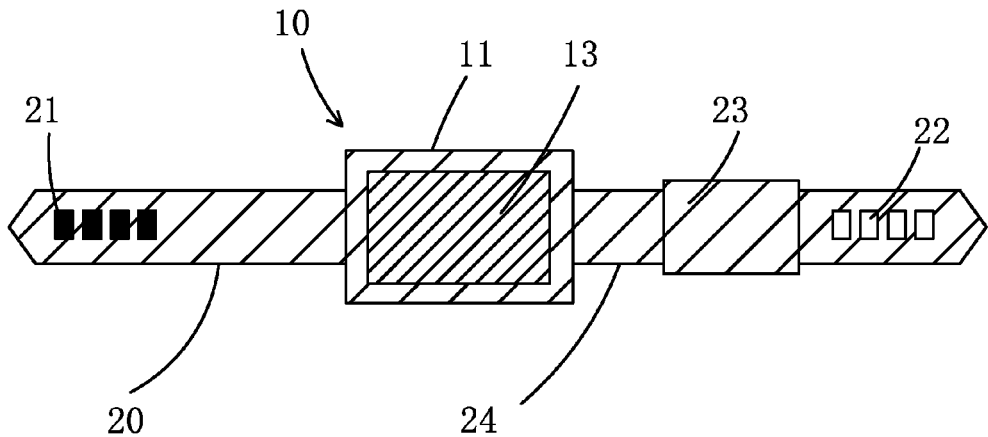
FIG. 2 is a schematic view showing the structure of the back of the smart watch provided by the first embodiment of the present invention.
Figure 3:
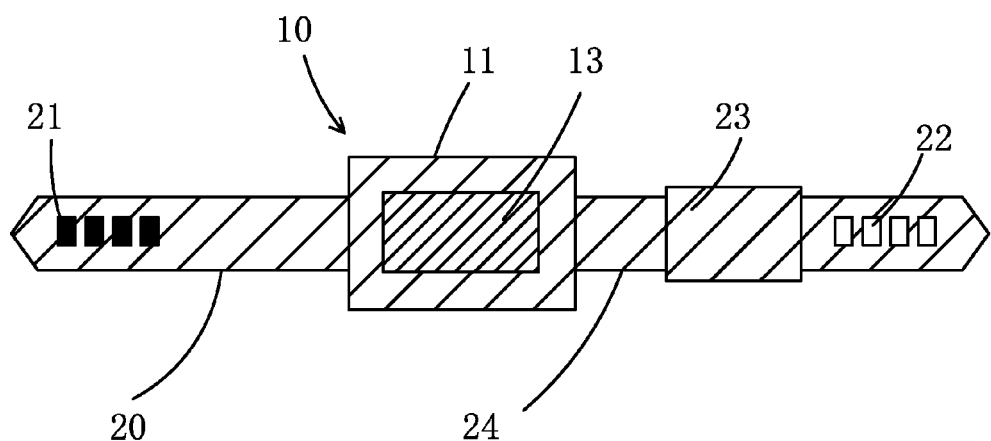
FIG. 3 is a schematic view showing the structure of the back of the smart watch provided by the second embodiment of the present invention.

Specifically, the shape and size of the first display 12 and the second display 13 can vary according to applications. Refer to FIG. 1 and FIG. 2 for the first embodiment of the present invention. The first display 12 and the second display 13 are both rectangular, and have the same size. Refer to FIG. 1 and FIG. 3 for the second embodiment of the present invention. The first display 12 and the second display 13 are both rectangular, and have the different sizes. Because both the front and the back of the smart watch comprise a display, the user can view the displayed contents on the display when wearing with the front or the back facing upwards respectively for complex function arrangements. For example, the first display 12 displays the date and time, and the second display 13 displays the daily schedule so that when wearing the smart watch with the front facing up, the user can view the date and time, while when wearing the smart watch with the back facing up, the user can view the daily schedule.

Figure 4:
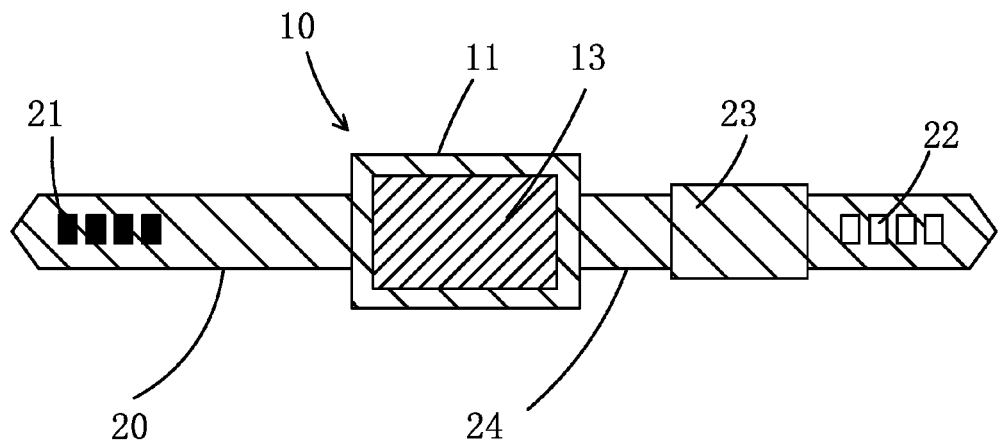
FIG. 4 is a schematic view showing the structure of the back of the smart watch provided by the third embodiment of the present invention.
Figure 5:
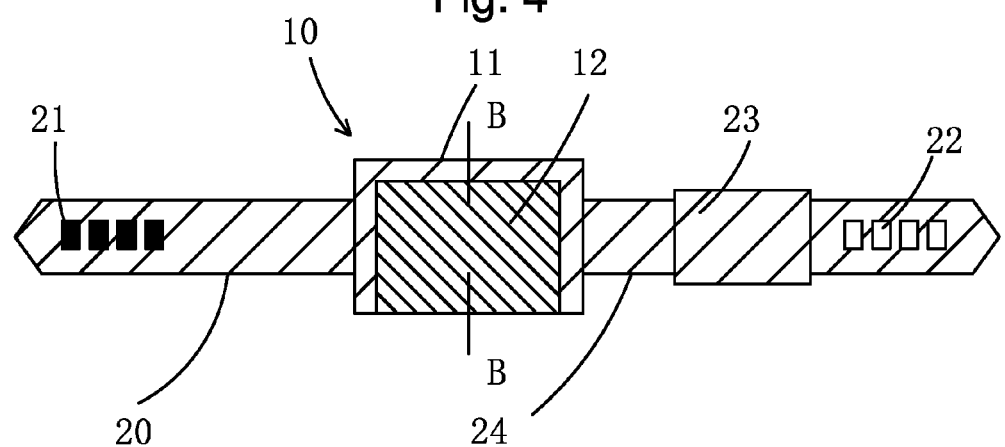
FIG. 5 is a schematic view showing the structure of the front of the smart watch provided by a fourth embodiment of the present invention.
Figure 6:
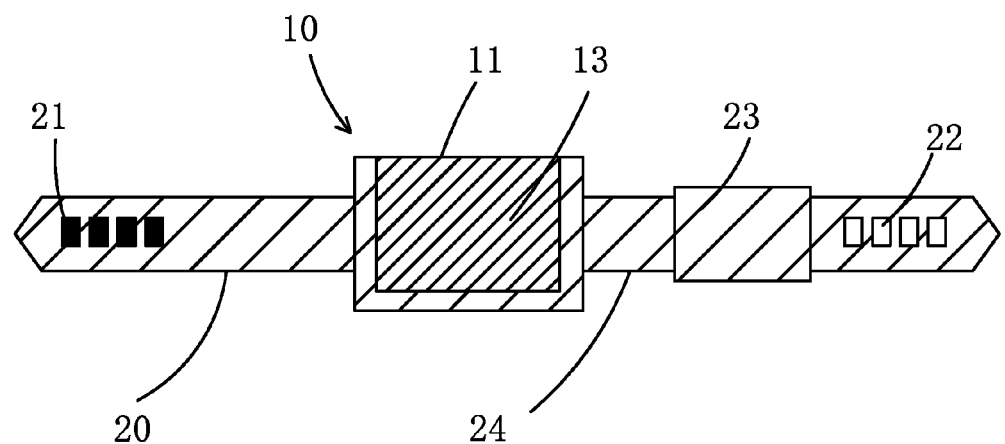
FIG. 6 is a schematic view showing the structure of the back of the smart watch provided by the fourth embodiment of the present invention.

Specifically, the fronts of the shell body 11, the first strap 20, the second strap 24 and the backs of the shell body 11, the first strap 20, and the second strap 24 may have the same or different appearance designs depending on the application. Refer to FIG. 1 and FIG. 2 for the first embodiment of the present invention. The fronts of the shell body 11, the first strap 20, the second strap 24 and the backs of the shell body 11, the first strap 20, and the second strap 24 have the same appearance design. Refer to FIG. 1 and FIG. 4 for the third embodiment of the present invention. The fronts of the shell body 11, the first strap 20, the second strap 24 and the backs of the shell body 11, the first strap 20, and the second strap 24 have different appearance designs.

Furthermore, the appearance design can vary in color, pattern or style, and so on. For example, the fronts of the shell body 11, the first strap 20, the second strap 24 are in the silver color suitable for men, while the backs of the shell body 11, the first strap 20, and the second strap 24 are in the rose gold color suitable for women. With different designs on both the front and back sides, the smart watch can be worn either side to satisfy various esthetics demands.

Specifically, refer to FIGS. 1-4, and FIG. 7. In the first, second and third embodiments of the present invention, both the first display 12 and the second display 13 are located at the center of the shell body 11 and surrounded by the shell body 11 on four sides. Refer to FIGS. 5-6, and FIGS. 8-9. In the fourth embodiment of the present invention, both the first display 12 and the second display 13 are surrounded by the U-shape of the shell body 11.

Figure 8:
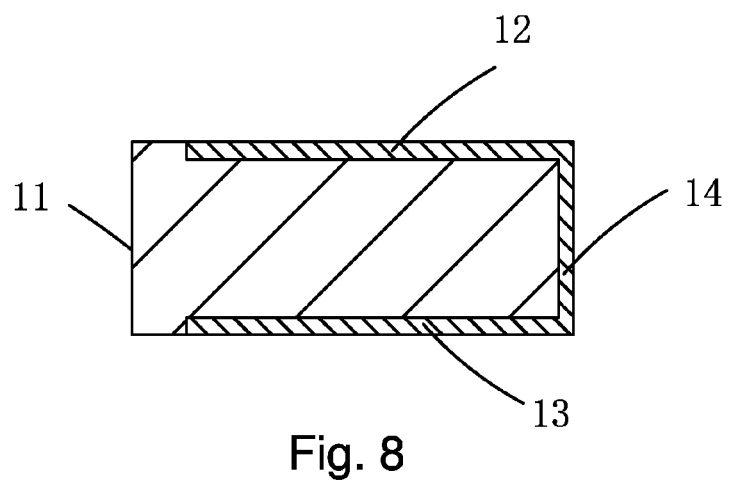
FIG. 8 is a first cross-sectional view along B-B direction showing the fourth embodiment in FIG. 5.

It should be noted that, referring to FIG. 8, the shell body 11 further comprises a third display 14 disposed on the side of the shell body 11 to further expand the display area of the smart watch.

Specifically, the first display 12, the second display 13 and the third display 14 can be independent displays; alternatively, the first display 12, the second display 13 and the third display 14 can be made monolithically from a display motherboard 100 and are controlled by the same control circuit.

Figure 10:
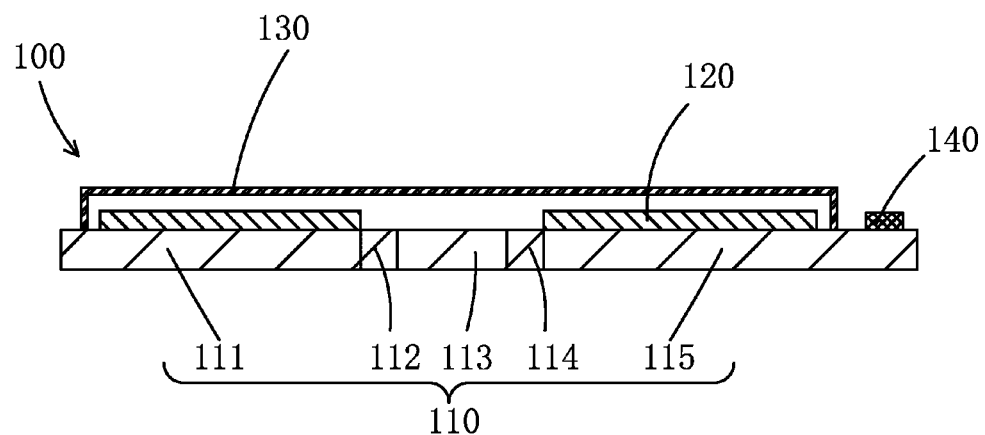
FIG. 10 is a schematic view showing the first structure of the OLED display motherboard of the smart watch provided by the present invention.
Figure 11:
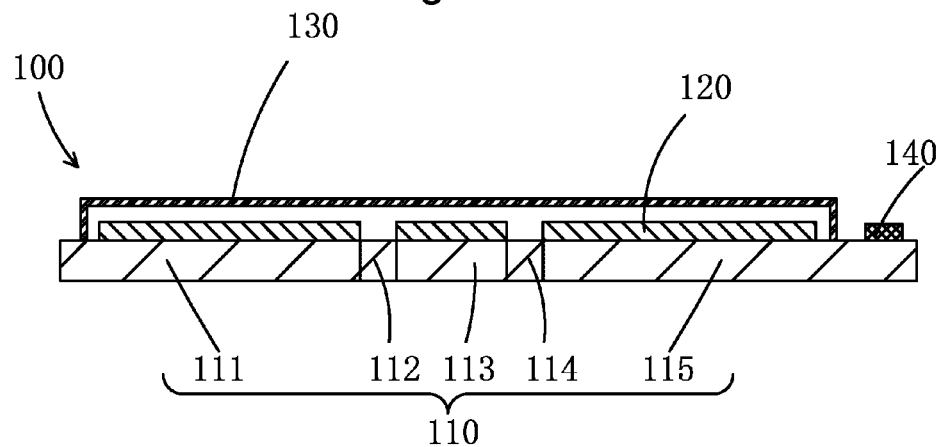
FIG. 11 is a schematic view showing the second structure of the OLED display motherboard of the smart watch provided by the present invention.
Figure 12:
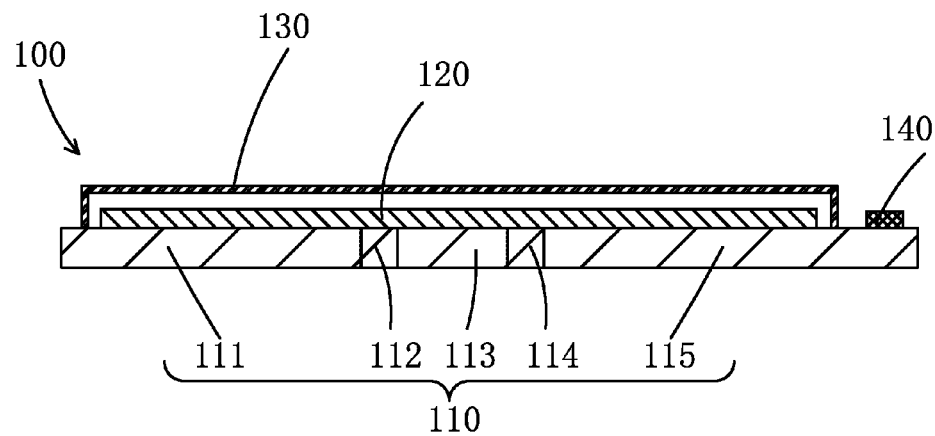
FIG. 12 is a schematic view showing the third structure of the OLED display motherboard of the smart watch provided by the present invention.

Moreover, when made monolithically from a display motherboard 100, the control circuit can be further simplified to improve the quality of the smart watch. Refer to FIGS. 10-12. The display motherboard 100 is a flexible OLED display motherboard. Refer to FIGS. 4-7. The display motherboard 100 comprises: a substrate 110, a light-emitting layer 120 disposed on the substrate 110, an encapsulation layer 130 disposed on the substrate 110 surrounding the light-emitting layer 120, and a control circuit connection area 140 disposed on the substrate 110 outside of the layer encapsulation layer 130.

Wherein, the substrate 110 is a flexible substrate, and comprises a first light-emitting area 111, a first bending area 112, a connection area 113, a second bending area 114, and a second light-emitting area 115, disposed consecutively.

Specifically, the sizes of the first bending area 112, connection area 113, second bending area 114, and second light-emitting area 115 can vary depending on the application.

The location that the light-emitting layer 120 covers can also vary depending on the application.

Optionally, the smart watch comprises the first display 12, the second display 13 and the third display 14. As shown in FIG. 10, the light-emitting layer 120 covers the first light-emitting area 111 and the second light-emitting area 115, and is disposed with a trench corresponding to the locations of the first bending area 112, the connection area and the second bending area 114, respectively.

The first light-emitting are 111 and the second light-emitting area 115 covered by the light-emitting layer 120 are electrically connected through metal wires of the trench.

The display motherboard 100 has a bend at the first bending area 112 and a second bending area 114, respectively, so that the first light-emitting area 111 and the second light-emitting area 115 are located respectively on the front and the back of the shell body 11, and form the first display 12 and the second display 13 by connecting to a control circuit through the control circuit connection area 140.

Figure 7:
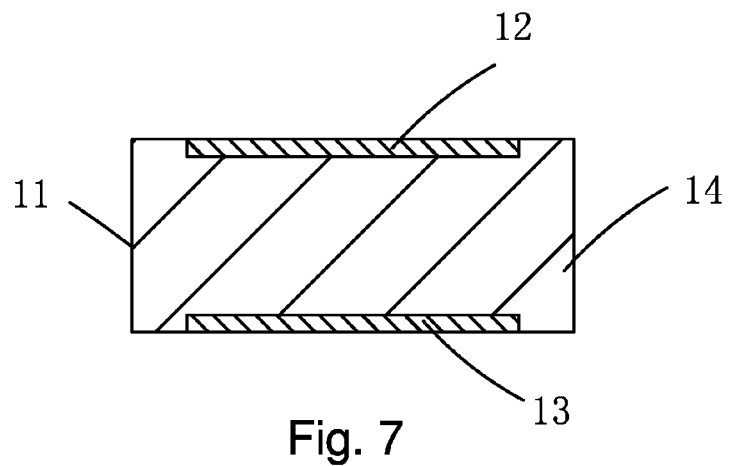
FIG. 7 is a cross-sectional view along A-A direction showing the first, second and third embodiments in FIG. 1.
Figure 9:
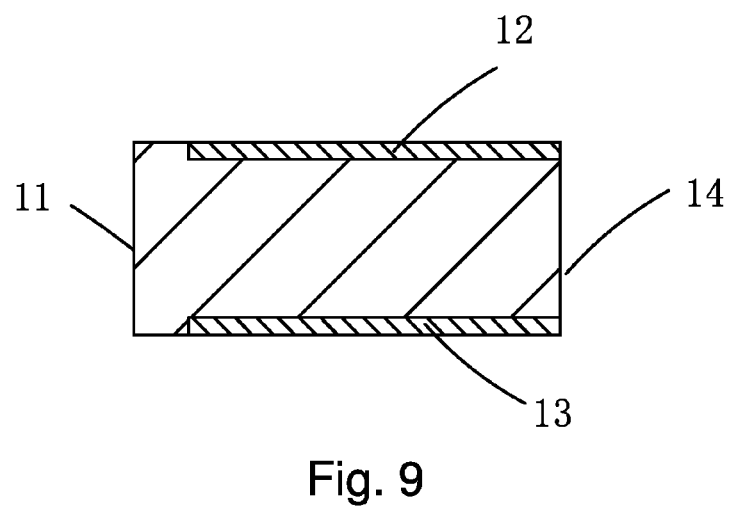
FIG. 9 is a second cross-sectional view along B-B direction showing the fourth embodiment in FIG. 5.

Furthermore, the widths of the first bending area 112 and the second bending area 114 are adjustable. When the widths of the first bending area 112 and the second bending area 114 are wider, the first display 12 and the second display 13 are located at the center of the shell body 11 after bending and are surrounded by the shell body 11 on four sides, as shown in FIG. 7. When the widths of the first bending area 112 and the second bending area 114 are narrower, the first display 12 and the second display 13 are surrounded by the U-shape shell body 11 after bending, as shown in FIG. 9.

Optionally, the smart watch can also comprises the third display 14 disposed at a side of the shell body 11 in addition to the first and the second displays 12, 13, as shown in FIG. 11. The light-emitting layer 120 covers the first light-emitting area 111, the connection area 113 and the second light-emitting area 115, and forms a trench at the locations corresponding to the first bending area 112 and the second bending area 114 respectively.

The first light-emitting are 111, the connection area 113 and the second light-emitting area 115 covered by the light-emitting layer 120 are electrically connected through metal wires of the trench.

The display motherboard 100 has a bend at the first bending area 112 and a second bending area 114, respectively, so that the first light-emitting area 111, the connection area 113 and the second light-emitting area 115 are located respectively on the front, the side and the back of the shell body 11, and form the first display 12, the third display 14 and the second display 13 by connecting to a control circuit through the control circuit connection area 140.

Optionally, the smart watch can also comprises the third display 14 disposed at a side of the shell body 11 in addition to the first and the second displays 12, 13, as shown in FIG. 12. The light-emitting layer 120 covers the first light-emitting area 111, the first bending area 112, the connection area 113, the second bending area 114 and the second light-emitting area 115. The light-emitting layer 120 does not comprise any trench.

The display motherboard 100 has a bend at the first bending area 112 and a second bending area 114, respectively, so that the first light-emitting area 111, the connection area 113 and the second light-emitting area 115 are located respectively on the front, the side and the back of the shell body 11, and form the first display 12, the third display 14 and the second display 13 by connecting to a control circuit through the control circuit connection area 140.

In summary, the present invention provides a smart watch, which comprises: a dial, a first strap and a second strap, connected respectively to both sides of the dial; wherein a first display and a second display are disposed respectively on a front and a back of the shell body of the dial, the first and the second straps are disposed with a plurality of clasps and clasp holes correspondingly, and the first and the second displays can have the same or different shapes and sizes, depending on the design for the watch to be worn on both front and back, so that when worn on different side, different display can be viewed to realize more complex application. Designing different appearances for the front and back of the smart watch satisfies various esthetics, and manufacturing the first and second displays monolithically simplifies the control circuit to improve quality of the smart watch.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A smart watch, which comprises: a dial (10), a first strap (20) and a second strap (24), connected respectively to both sides of the dial (10);
   the dial (10) comprising a shell body (11), a first display (12) disposed on a front of the shell body (11), a second display (13) disposed on a back of the shell body (11), and a control circuit disposed inside the shell body (11) to electrically connect the first display (12) and the second display (13);
   wherein the first display (12) and the second display (13) are monolithically made from a display motherboard (100), and are controlled by the same control circuit; and
   wherein the display motherboard (100) is a flexible organic light-emitting diode (OLED) display motherboard;
   the display motherboard (100) comprises: a substrate (110), a light-emitting layer (120) disposed on the substrate (110), an encapsulation layer (130) disposed on the substrate (110) surrounding the light-emitting layer (120), and a control circuit connection area (140) disposed on the substrate (110) outside of the layer encapsulation layer (130);
   the substrate (110) being a flexible substrate, comprising a first light-emitting area (111), a first bending area (112), a connection area (113), a second bending area (114), and a second light-emitting area (115) disposed consecutively;
   the light-emitting layer (120) covering the first light-emitting area (111) and the second light-emitting area (115), and being disposed with a trench corresponding to the locations of the first bending area (112), the connection area (113) and the second bending area (114);
   the light-emitting layer (120) covering the first light-emitting area (111) and the second light-emitting area (115) being electrically connected through metal wires of the trench;
   the display motherboard (100) having a bend at the first bending area (112) and a second bending area (114) respectively, so that the first light-emitting area (111) and the second light-emitting area (115) of the substrate (110) located respectively on the front and the back of the shell body (11), and being connected to a control circuit through the control circuit connection area (140) to form the first display (12) and the second display (13).

2. The smart watch as claimed in claim 1, wherein the first strap (20) is disposed with a plurality of clasps (21); and
   the second strap (24) is disposed with a plurality of clasp holes (22) corresponding to the plurality of clasps (21); and the clasps (21) are dual-sided clasps.

3. The smart watch as claimed in claim 1, wherein the first display (12) and the second display (13) are of the same or difference sizes and shapes.

4. A smart watch, comprising: a dial (10), a first strap (20) and a second strap (24), connected respectively to both sides of the dial (10);
   wherein the dial (10) comprises a shell body (11), a first display (12) disposed on a front of the shell body (11), a second display (13) disposed on a back of the shell body (11), and a control circuit disposed inside the shell body (11) to electrically connect the first display (12) and the second display (13);
   wherein the dial (10) further comprises a third display (14) disposed on the side of the shell body (11);
   wherein the first display (12), the second display (13) and the third display (14) are made monolithically from a display motherboard (100) and are controlled by the same control circuit; and
   wherein the display motherboard (100) is a flexible organic light-emitting diode (OLED) display motherboard;
   the display motherboard (100) comprises: a substrate (110), a light-emitting layer (120) disposed on the substrate (110), an encapsulation layer (130) disposed on the substrate (110) surrounding the light-emitting layer (120), and a control circuit connection area (140) disposed on the substrate (110) outside of the layer encapsulation layer (130);
   the substrate (110) being a flexible substrate, comprising a first light-emitting area (111), a first bending area (112), a connection area (113), a second bending area (114), and a second light-emitting area (115) disposed consecutively;
   the light-emitting layer (120) covering the first light-emitting area (111), the connection area (113) and the second light-emitting area (115), and being disposed with a trench corresponding to the locations of the first bending area (112) and the second bending area (114);
   the light-emitting layer (120) covering the first light-emitting area (111), the connection area (113) and the second light-emitting area (115) being electrically connected through metal wires of the trench;
   the display motherboard (100) having a bend at the first bending area (112) and a second bending area (114) respectively, so that the first light-emitting area (111), the connection area (113) and the second light-emitting area (115) of the substrate (110) located respectively on the front, a side and the back of the shell body (11), and being connected to a control circuit through the control circuit connection area (140) to form the first display (12), the third display (14) and the second display (13).

5. The smart watch as claimed in claim 4, wherein the first strap (20) is disposed with a plurality of clasps (21); and
   the second strap (24) is disposed with a plurality of clasp holes (22) corresponding to the plurality of clasps (21); and the clasps (21) are dual-sided clasps.

6. The smart watch as claimed in claim 5, wherein the first display (12) and the second display (13) are of the same or difference sizes and shapes.

7. A smart watch, comprising: a dial (10), a first strap (20) and a second strap (24), connected respectively to both sides of the dial (10);
   wherein the dial (10) comprises a shell body (11), a first display (12) disposed on a front of the shell body (11), a second display (13) disposed on a back of the shell body (11), and a control circuit disposed inside the shell body (11) to electrically connect the first display (12) and the second display (13);
   wherein the dial (10) further comprises a third display (14) disposed on the side of the shell body (11);
   wherein the first display (12), the second display (13) and the third display (14) are made monolithically from a display motherboard (100) and are controlled by the same control circuit; and
   wherein the display motherboard (100) is a flexible organic light-emitting diode (OLED) display motherboard;
   the display motherboard (100) comprises: a substrate (110), a light-emitting layer (120) disposed on the substrate (110), an encapsulation layer (130) disposed on the substrate (110) surrounding the light-emitting layer (120), and a control circuit connection area (140) disposed on the substrate (110) outside of the layer encapsulation layer (130);
   the substrate (110) being a flexible substrate, comprising a first light-emitting area (111), a first bending area (112), a connection area (113), a second bending area (114), and a second light-emitting area (115) disposed consecutively;
   the light-emitting layer (120) covering the first light-emitting area (111), the first bending area (112), the connection area (113), the second bending area (114) and the second light-emitting area (115);
   the display motherboard (100) having a bend at the first bending area (112) and a second bending area (114) respectively, so that the first light-emitting area (111), the connection area (113) and the second light-emitting area (115) of the substrate (110) located respectively on the front, a side and the back of the shell body (11), and being connected to a control circuit through the control circuit connection area (140) to form the first display (12), the third display (14) and the second display (13).

8. The smart watch as claimed in claim 7, wherein the first strap (20) is disposed with a plurality of clasps (21); and
   the second strap (24) is disposed with a plurality of clasp holes (22) corresponding to the plurality of clasps (21); and the clasps (21) are dual-sided clasps.

9. The smart watch as claimed in claim 8, wherein the first display (12) and the second display (13) are of the same or difference sizes and shapes.

* * * * *